(12) United States Patent
Yuan et al.

(10) Patent No.: US 10,944,397 B1
(45) Date of Patent: Mar. 9, 2021

(54) COMPACT FOUR-TERMINAL TCOIL

(71) Applicant: Cadence Design Systems, Inc., San Jose, CA (US)

(72) Inventors: Xiaobin Yuan, San Jose, CA (US); Dimitri Loizos, San Jose, CA (US); Hiu Ming Lam, San Jose, CA (US); Mouna Safi-Harab, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 16/779,400

(22) Filed: Jan. 31, 2020

(51) Int. Cl.
| | | |
|---|---|---|
| *H04B 3/00* | (2006.01) | |
| *H03K 17/687* | (2006.01) | |
| *H04L 25/02* | (2006.01) | |
| *H04B 1/04* | (2006.01) | |

(52) U.S. Cl.
CPC ....... *H03K 17/6872* (2013.01); *H04B 1/0475* (2013.01); *H04L 25/028* (2013.01); *H04L 25/0272* (2013.01)

(58) Field of Classification Search
CPC ............ H03K 17/6872; H04L 25/0272; H04L 25/028; H04B 1/0475
USPC ......................................... 375/257, 258, 295
See application file for complete search history.

(56) References Cited

U.S. PATENT DOCUMENTS

| | | | |
|---|---|---|---|
| 9,197,195 B2 | 11/2015 | Huang et al. | |
| 9,621,136 B1 * | 4/2017 | Chang ................ | H03K 3/35613 |
| 10,027,297 B2 | 7/2018 | Yuan et al. | |
| 10,243,531 B1 | 3/2019 | Thiagarajan et al. | |
| 10,498,139 B2 | 12/2019 | Fan | |
| 10,681,802 B1 * | 6/2020 | Beukema ............. | H05K 1/0248 |
| 2011/0248811 A1 * | 10/2011 | Kireev ................ | H01L 23/5227 336/200 |
| 2014/0176242 A1 * | 6/2014 | Lin ......................... | H03H 7/38 330/277 |
| 2019/0253284 A1 * | 8/2019 | Jalali Far ................ | H03H 7/38 |

OTHER PUBLICATIONS

Kossel et al., "A T-Coil Enhance 8.5 G/s High-Swing SST Transmitter in 65 nm Bulk CMOS With < - 16dB Return Loss Over 10 GHz Bandwidth" IEEE Journal of Solid-State Circuits, vol. 42, No. 12, Dec. 2008, pp. 2905-2920.

Paramesh et al., "Analysis of the Bridged T-Coil Circuit Using the Extra-Element Theorem", IEEE Transactions on Circuits and Systems—II: Express Briefs, vol. 53, No. 12, Dec. 2006, pp. 1408-1412.

Razavi, "The Bridged T-Coil", IEEE Solid-State Circuits Magazine, Dec. 2, 2015, pp. 9-13.

Roy, Comments on "Analysis of the Bridged T-coil Circuit Using the Extra-Element Theorem", IEEE Transactions on Circuits and Systems—II: Express Briefs, vol. 54, No. 8, Aug. 2007, pp. 673-674.

* cited by examiner

Primary Examiner — Don N Vo
(74) Attorney, Agent, or Firm — Foley & Lardner LLP (57) ABSTRACT

The present embodiments relate generally to data communications, and more particularly to systems including high-speed serializer-deserializer circuits having TCOILs. One or more embodiments are directed to a four-terminal TCOIL structure that consumes the same amount of area on a chip as a traditional three-terminal structure, while providing more bandwidth and less reflection and group delay variation.

20 Claims, 10 Drawing Sheets

COMPACT FOUR-TERMINAL TCOIL

TECHNICAL FIELD

The present embodiments relate generally to data communications, and more particularly to systems including high-speed serializer-deserializer circuits having TCOILs.

BACKGROUND

As the Internet and other communications networks continue to mature, high volume and high data bit-rate activities such as multimedia streaming and cloud computing are becoming more popular. To accommodate these wide data bandwidth applications, faster network services are required. To facilitate network services, network routers and servers typically include a serializer-deserializer system (SerDes). A SerDes includes a serial data link transceiver. A transceiver includes: (i) a receiver (RX), which receives high speed serial data and parallelizes the serial data into lower frequency, multi-bit data words and (ii) a transmitter (TX) which serializes multi-bit data words into high rate single-bit streams that can be sent over a serial communication channel.

Escalating mobile data consumption, burgeoning AI and machine learning applications and emerging 5G communications requirements demand ever-increasing bandwidth, straining the existing cloud datacenter server, storage and networking infrastructure. Early adopters in the high-end cloud datacenter market are now installing 400G Ethernet ports, with 400G Ethernet expected to go mainstream in 2020 as early adopters begin 800G Ethernet deployment. Although 112G SerDes technology doubles the data rate of 56G SerDes, meeting the exploding high-speed connectivity needs for emerging data-intensive applications such as machine learning and neural networks, there are many design challenges for enabling this increased data rate using existing SerDes circuits. For example, existing SerDes circuits commonly include devices such as TCOIL circuits, and the design challenges apply to these commonly incorporated circuits as well.

SUMMARY

The present embodiments relate generally to data communications, and more particularly to systems including high-speed serializer-deserializer circuits having TCOILs. One or more embodiments are directed to a four-terminal TCOIL structure that consumes the same amount of area on a chip as a traditional three-terminal structure, while providing more bandwidth and less reflection and group delay variation.

BRIEF DESCRIPTION OF THE DRAWINGS

These and other aspects and features of the present embodiments will become apparent to those ordinarily skilled in the art upon review of the following description of specific embodiments in conjunction with the accompanying figures, wherein.

DETAILED DESCRIPTION

The present embodiments will now be described in detail with reference to the drawings, which are provided as illustrative examples of the embodiments so as to enable those skilled in the art to practice the embodiments and alternatives apparent to those skilled in the art. Notably, the figures and examples below are not meant to limit the scope of the present embodiments to a single embodiment, but other embodiments are possible by way of interchange of some or all of the described or illustrated elements. Moreover, where certain elements of the present embodiments can be partially or fully implemented using known components, only those portions of such known components that are necessary for an understanding of the present embodiments will be described, and detailed descriptions of other portions of such known components will be omitted so as not to obscure the present embodiments. Embodiments described as being implemented in software should not be limited thereto, but can include embodiments implemented in hardware, or combinations of software and hardware, and vice-versa, as will be apparent to those skilled in the art, unless otherwise specified herein. In the present specification, an embodiment showing a singular component should not be considered limiting; rather, the present disclosure is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present embodiments encompass present and future known equivalents to the known components referred to herein by way of illustration.

According to certain aspects, the present embodiments aim to solve design challenges in wireline transmitter and receiver terminations, and in particular such terminations that include TCOILs.

More particularly, as set forth above, SerDes components are becoming increasingly common in many applications. The trend has involved increasing the number of serial links at higher and higher speeds in smaller geometry processes. This may be necessary in order to provide the data transmission requirements of higher capacity chips that are severely pin limited. A high speed serial link requires data and clock recovery for wired applications such as backplanes, networks and chip to chip communication. Some industry standards for this type of communication include but are not limited to, Peripheral Component Interconnect Express ("PCIe"), Common Electrical Interface ("CEI-6"), 10 Gigabit Attachment Unit Interface ("XAUI") (IEEE 802.3ae), Serial ATA ("SATA"), Fibrechannel, 802.3ap (e.g., 10GBASE-KR) and others. In this way, transfer data rates from 2.5 Gb/s, up to as high as 112 Gb/s are becoming common.

Figure 1:
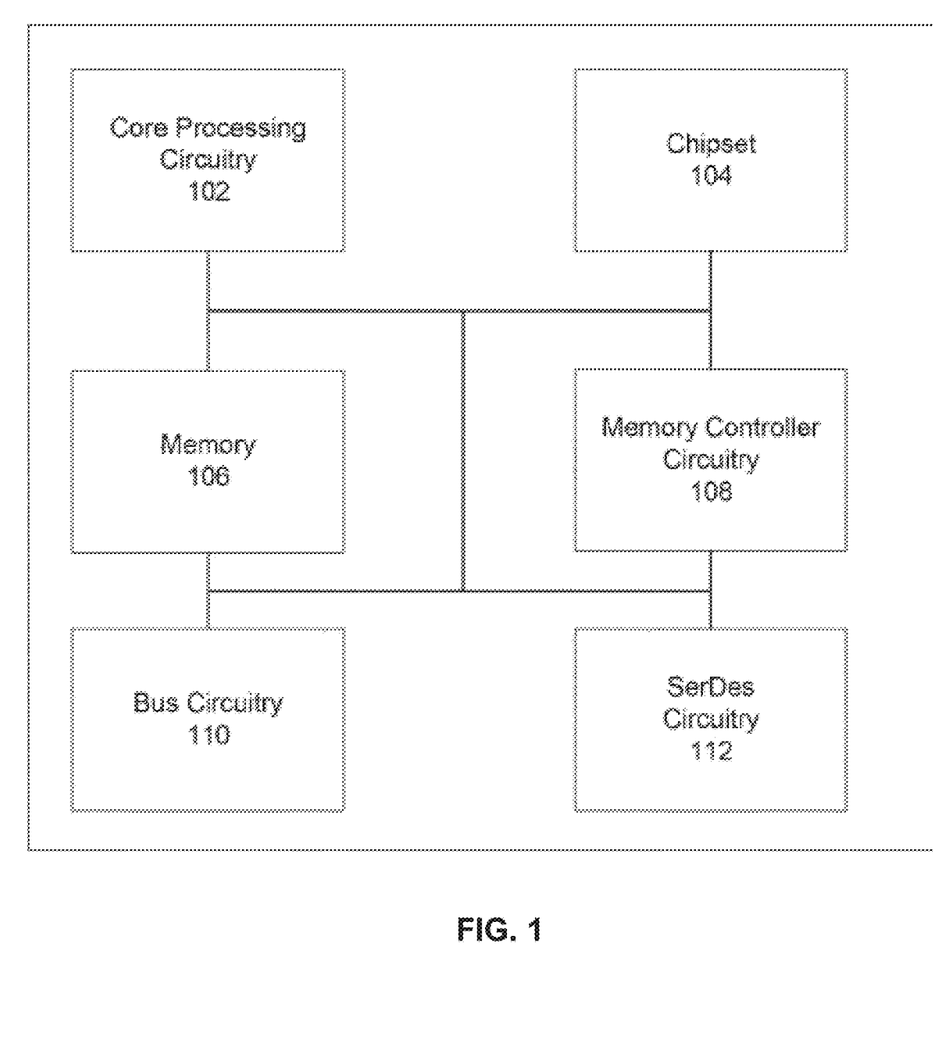
FIG. 1 is a block diagram of an example integrated circuit (IC) 100 in which embodiments of the present disclosure can find useful application.

Referring now to FIG. 1, an example integrated circuit (IC) 100 in which embodiments of the present disclosure can find useful application is shown. The term "integrated circuit", as used in any embodiment herein, may refer to a semiconductor device and/or microelectronic device, such as, for example, an application specific integrated circuit (ASIC), a field programmable gate array (FPGA) and/or a system on a chip (SOC). The specific configuration, arrangement, and components shown in IC 100 are provided merely for exemplary purposes as additional and/or alternative configurations are also within the scope of the present disclosure. More particularly, the principles of the present embodiments can be practiced in SerDes circuitry that can be included in many different devices or circuits other than those similar to the example IC 100, and so the particular details of IC 100 are not important for an understanding of the present embodiments. The principles of the present embodiments can be further extended to integrated circuits that include fewer or more components than shown in the example IC 100.

In this illustrated example, IC 100 includes core processing circuitry 102, which may include a variety of different processors such as those known in the art. Any suitable processor may be used without departing from the scope of the present disclosure. IC 100 may also include chipset 104. In some embodiments, chipset 104 may include both Northbridge/memory controller hub (MCH) and Southbridge/I/O controller hub (ICH) circuitry. These components may be included within chipset 104 or at any other location within IC 100. IC 100 may also include memory 106, which may be in communication with core processing circuitry 102. Memory 106 may comprise one or more of the following types of memories: semiconductor firmware memory, programmable memory, non-volatile memory, read only memory, electrically programmable memory, random access memory, flash memory (which may include, for example, NAND or NOR type memory structures), magnetic disk memory, and/or optical disk memory. Either additionally or alternatively, memory may comprise other and/or later-developed types of computer-readable memory. In some embodiments, memory 106 may include, for example, 256 KB of two-way level 2 cache. IC 100 may additionally include memory controller circuitry 108 configured to manage the flow of data to and from memory. For example, in some embodiments, memory controller circuitry 108 may include a double-data-rate two synchronous dynamic random access memory (DDR2 SDRAM) controller. IC 100 may further include bus circuitry 110 configured to provide compatibility with a variety of different bus architectures, including, but not limited to, Universal Serial Bus (USB), Serial Advanced Technology Attachment (SATA), Peripheral Component Interface (PCI), PCI-Express and System Management Bus (SMBus).

As further shown in this example, IC 100 may also include SerDes circuitry 112. Circuitry 112 can include a plurality of transceivers, each transceiver including a receiver (RX),—which receives high speed serial data from a serial communication channel and parallelizes the serial data into lower frequency, multi-bit data words—and a transmitter (TX)—which serializes multi-bit data words into high rate single-bit streams that can be sent over the serial communication channel.

As should be appreciated by those skilled in the art, integrated circuits such as IC 100 are developed for a target fabrication process. Common fabrication processes include CMOS processes, with nodes at 400 nm and lower. As should be further appreciated, in such processes, the semiconductor die implementing IC 100 can include many metal and other layers in which the circuits such as 102, 104, 106, 108, 110 and 112 are formed. The die has bumps to connect the components of IC 100 to package pins and external circuits. In general, the circuits implementing circuitry 112 are much less complex than other circuitry in IC 100, but the overall IC must conform to space requirements, as there is continuous market pressure to reduce the sizes of ICs.

Figure 2:
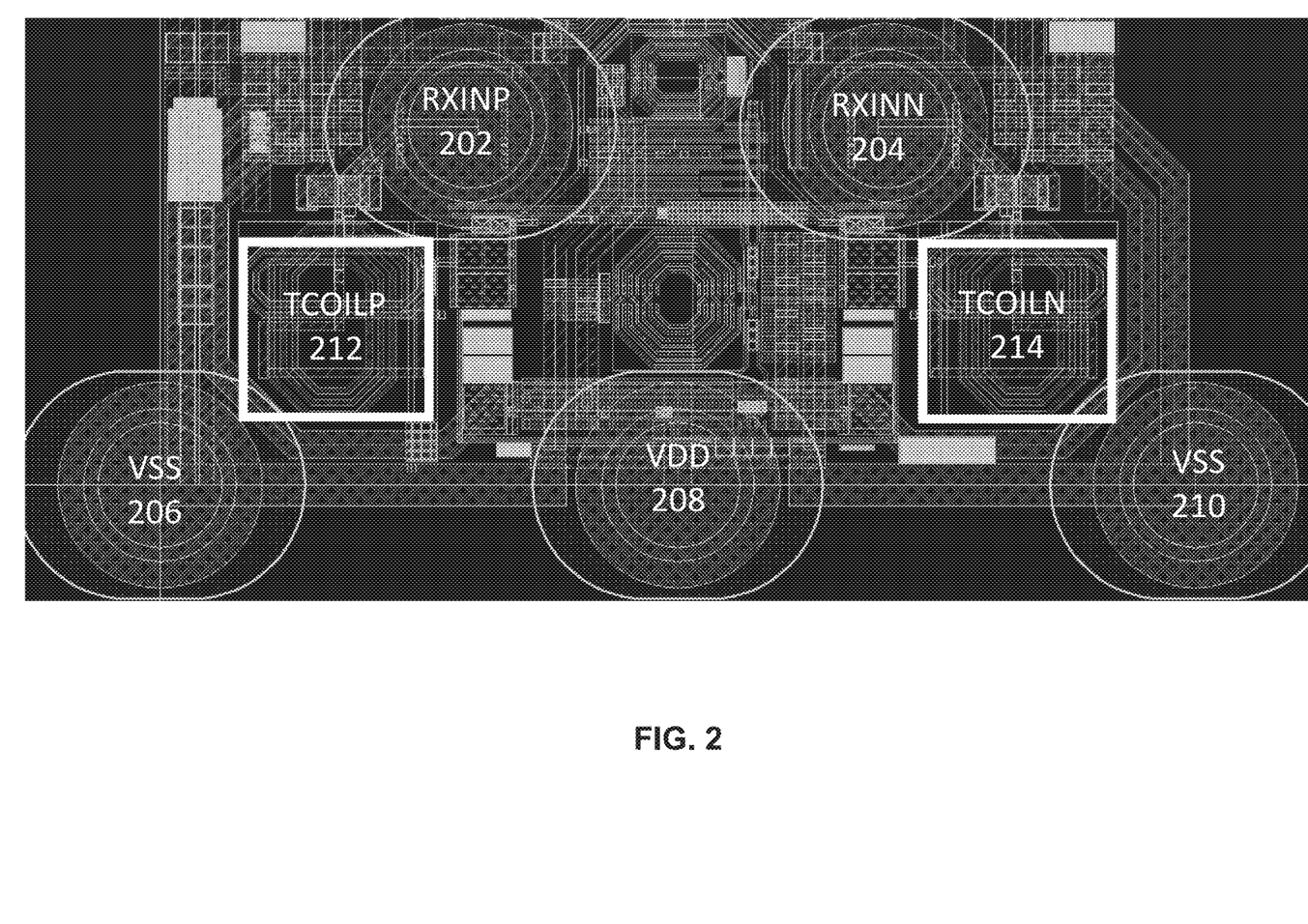
FIG. 2 is a layout diagram for a portion of an example IC having a transceiver that can be included in SerDes circuitry 112 in FIG. 1.

A layout diagram for a portion of an example IC having a transceiver that can be included in SerDes circuitry 112 in FIG. 1 is shown in FIG. 2.

As shown, the portion of the circuit includes bumps RXINP 202 and RXINN 204 for the differential signal terminations of the receiver. The illustrated portion also includes bumps 206, 208 and 210 for the power and ground inputs (e.g. VDD/VSS) for the receiver. It should be appreciated that a SerDes transceiver can further include similar components for the transmitter. However, only the receiver components are shown in FIG. 2 for ease of illustration.

As device dimensions decrease and the operating speed of semiconductor ICs increases, devices/transistors on an IC become increasingly vulnerable to ESD. Use of ESD protection devices (referred to herein as ESD devices) may provide protection to the chip during an ESD event. A TCOIL circuit may improve circuit performance by reducing high frequency signal loss due to ESD capacitance loading introduced by the ESD devices. On-chip ESD loading capacitances of high speed input/output (IO) circuits reduce signal bandwidth. A TCOIL device may be utilized with inductive peaking from two inductor cores (e.g., arms) of both sides of the TCOIL to reduce high frequency signal loss due to this ESD capacitance loading.

Accordingly, FIG. 2 shows the P and N portions 212 and 214, respectively, of a TCOIL circuit that can be included in the receiver terminations. As further shown in FIG. 2, these portions are required by the design to be included in an area between the bumps 202, 204, 206, 208 and 210. In one particular design of a 56 Gbps SerDes transceiver such as the example illustrated in FIG. 2, the portions 212 and 214 of the TCOIL must adhere to strict area requirements, for example that they are each confined to a maximum 65×65 $\mu m^2$ area. At the same time, the TCOIL itself must also adhere to certain performance requirements, such as bandwidth, loss, group delay and reflection requirements.

Figure 3A:
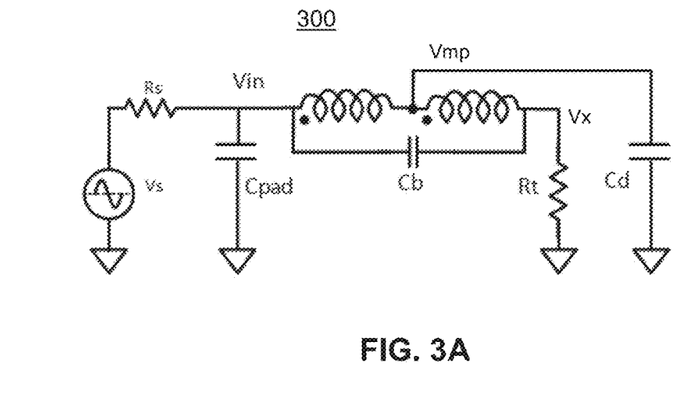
FIG. 3A is a schematic diagram of an example three-terminal TCOIL circuit.

A schematic diagram of an example three-terminal TCOIL circuit 300 is shown in FIG. 3A. Some or all of the components of this circuit 300 can be included in the P and N portions 212 and 214 of the TCOIL shown in FIG. 2.

More particularly, in the example circuit 300, the three terminals of the TCOIL are Vin (the bump input connecting to inductor L1), Vx (the termination connecting to inductor L2) and Vmp (the center tap between inductors L1 and L2). Also included in the TCOIL itself (i.e. within the three terminals) is bridge capacitance Cb. The bridge capacitance may be provided by a bridge capacitor or through an intrinsic plate-to-plate capacitance of the circuit 300, such as in overlapping coil portions of inductors L1 and L2. In many implementations, the center tap of the TCOIL is connected to an electrostatic discharge (ESD) device, which is represented by capacitance Cd. For completeness, FIG. 3A also shows input resistance Rs and input pad capacitance Cpad, and termination resistance Rt. The resistance of Rt may be set for impedance matching.

Figure 3B:
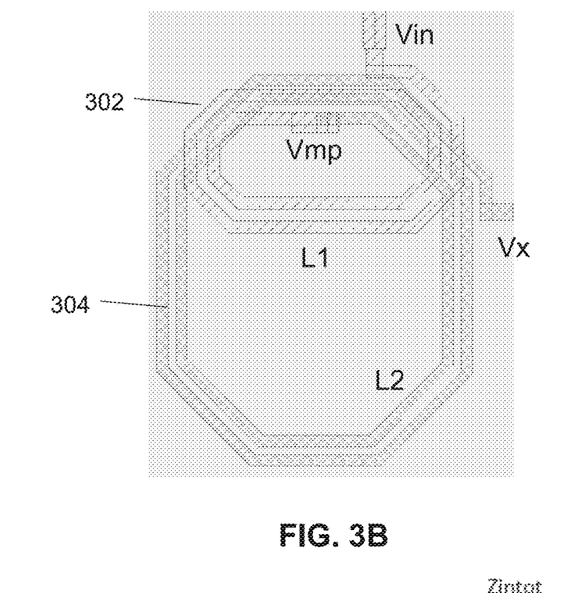
FIG. 3B is a corresponding layout diagram showing the TCOIL components implemented in layers of an example integrated circuit.

A corresponding layout diagram showing the TCOIL components of circuit 300 implemented in layers of an example integrated circuit is shown in FIG. 3B. These components can be included in the P and N portions 212 and 214 of the TCOIL shown in FIG. 2.

In the example of FIG. 3B, the coil 302 of inductor L1 may be provided in one metal layer of the integrated circuit, and the coil 304 of inductor L2 a second different metal layer of the integrated circuit. The center tap 306 may be provided in a third different metal layer of the integrated circuit. As set forth above, the center tap 306 may comprise a first terminal Vmp of the TCOIL, and FIG. 3B also shows the other two of the three terminals of the TCOIL Vin and Vx.

Figure 3C:
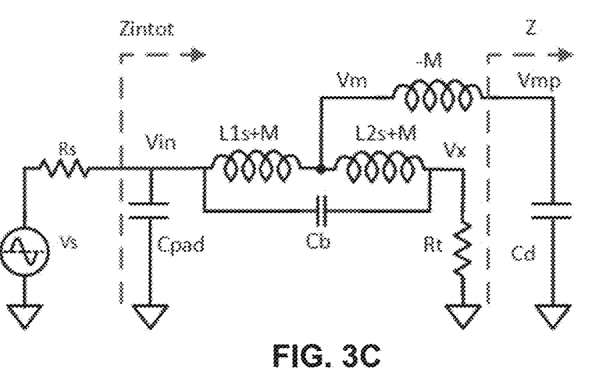
FIG. 3C is an equivalent circuit diagram of FIG. 3A for purposes of evaluating design considerations for a three-terminal TCOIL.

FIG. 3C is an equivalent circuit diagram of FIG. 3A for purposes of evaluating design considerations for a three-terminal TCOIL. More particularly, the equivalent circuit includes mutual inductance M for allowing an analysis to consider the coupling between inductors L1 and L2. As further shown in FIG. 3C, the analysis can include determining transfer function from the source Vs to the output node of Vmp, and evaluating the total input impedance Zintot.

The following equations can be obtained after replacing Cd with Z, and using KCL at nodes Vx (voltage on Rt), Vm, and Vin:

$$(Vin - Vx) \cdot S \cdot Cb = \frac{Vx}{Rt} - \frac{Vm - Vx}{S \cdot L2} \tag{1}$$

$$\frac{Vin - Vm}{S \cdot L1} = \frac{Vm - Vx}{S \cdot L2} + \frac{Vm}{Z - S \cdot M} \tag{2}$$

$$\frac{Vin - Vm}{S \cdot L1} + S \cdot Cb \cdot (Vin - Vx) = Iin \tag{3}$$

From equations (1) and (2), the following equations (4) (5) can be derived:

$$Vin \cdot S^2 \cdot L2 \cdot Rt \cdot Cb + Vm \cdot Rt = Vx \cdot (S^2 \cdot L2 \cdot Rt \cdot Cb + S \cdot L2 + Rt) \tag{4}$$

$$-L2 \cdot (Z-S \cdot M) \cdot Vin + [(L2+L1) \cdot (Z-S \cdot M) + L1 \cdot L2 \cdot S] \cdot Vm = L1 \cdot (Z-S \cdot M) \cdot Vx \tag{5}$$

From equations (4) and (5), and after substituting a, b and c as defined below in equations (6), (7) and (8), the following voltage transfer functions from Vin to Vm and Vx (Hvm (9), Hvx (10)) are derived. From these transfer functions the final equation (11) provides the input impedance from the pad looking in to the circuit (but not including Cpad):

$$a = S^2 \cdot L2 \cdot Rt \cdot Cb + S \cdot L2 + Rt \tag{6}$$

$$b = (L2 + L1) \cdot (Z - S \cdot M) + L1 \cdot L2 \cdot S \tag{7}$$

$$c = Z - S \cdot M \tag{8}$$

$$Hvm = \frac{Vm}{Vin} = \frac{L1 \cdot S^2 \cdot L2 \cdot Rt \cdot Cb \cdot c + L2 \cdot a \cdot c}{a \cdot b - Rt \cdot L1 \cdot c} \tag{9}$$

$$Hvx = \frac{Vx}{Vin} = \frac{S^2 \cdot L2 \cdot Rt \cdot Cb \cdot b + Rt \cdot L2 \cdot c}{a \cdot b - Rt \cdot L1 \cdot c} \tag{10}$$

$$Zin = \frac{Vin}{Iin} = \frac{S \cdot L1}{1 - Hvm + S^2 \cdot L1 \cdot Cb \cdot (1 - Hvx)} \tag{11}$$

So, the total input impedance Zintot including Cpad is given by:

$$Z_{INTOT} = \frac{1}{S \cdot Cpad + \frac{1}{Zin}} \tag{12}$$

The transfer function Hvmp referenced to Cpad is given by:

$$Hvmp = Hvm \cdot \frac{Z}{Z - S \cdot M} \tag{13}$$

The transfer function Hvmps referenced to source is given by:

$$Hvmps = Hvmp \cdot \frac{Z_{INTOT}}{Z_{INTOT} + Zs} \tag{14}$$

The input reflection coefficient at Cpad is given by:

$$\Gamma_{IN} = \frac{Z_{INTOT} - Zs}{Z_{INTOT} + Zs} \tag{15}$$

From equations (14) and (15), it is possible to evaluate the design tradeoffs for a three-terminal TCOIL. For example, it can be observed that an asymmetric TCOIL benefits BW/loss, and a significantly larger inductance for L2 as compared to inductor L1 is needed. Moreover, lower coupling between L1 and L2 benefits BW/loss, at the expense of group delay variation.

Figure 4A:
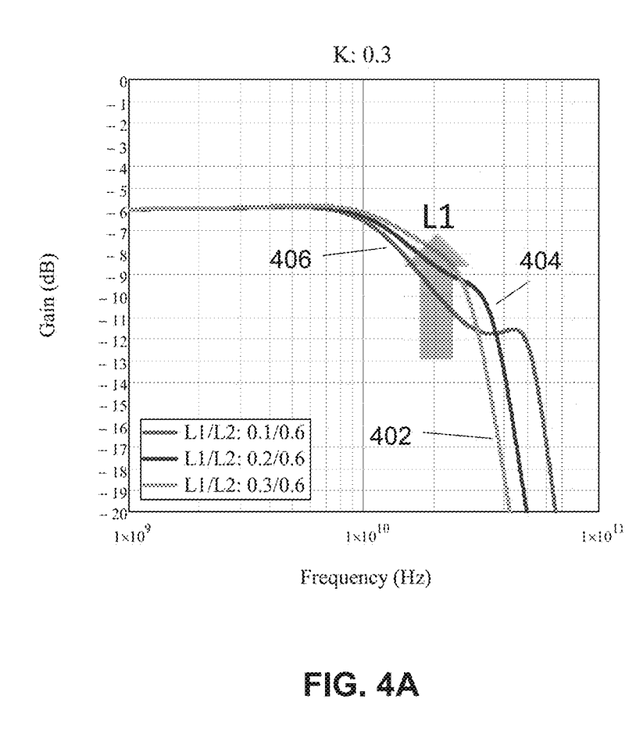
FIGS. 4A and 4B are waveform diagrams illustrating further aspects of design considerations.
Figure 4B:
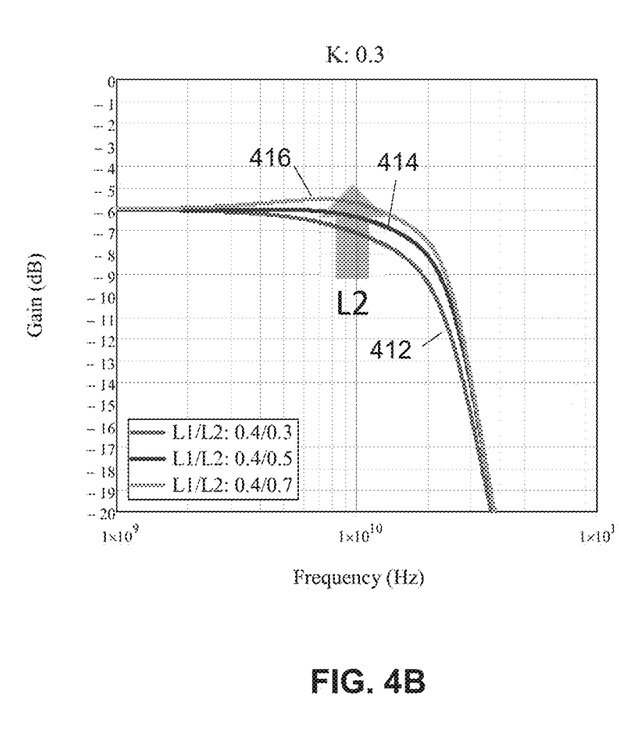

FIGS. 4A and 4B are waveform diagrams illustrating further aspects of design considerations using the foregoing transfer functions.

FIG. 4A shows the gain of an example three-terminal TCOIL circuit as a function of frequency for three different values of inductor L1 while keeping the value of inductor L2 fixed (at 600 pH) and the coupling factor K at 0.3. In this example, curve 402 is the gain where L1 is 300 pH, curve 404 is the gain where L1 is 200 pH and curve 406 is the gain where L1 is 100 pH. As can be seen from FIG. 4A, in this specific design, a smaller L1 sized around half of L2 creates peaking of the gain around 20 GHz as shown by the arrow.

FIG. 4B shows the gain of an example three-terminal TCOIL circuit as a function of frequency for three different values of inductor L2 while keeping the value of L1 fixed (at 400 pH) and the coupling factor K at 0.3. In this example, curve 412 is the gain where L2 is 300 pH, curve 414 is the gain where L2 is 500 pH and curve 416 is the gain where L2 is 700 pH. As can be seen from FIG. 4B, L2 is made larger relative to L1 in this example, it creates a peaking of the gain around 10 GHz.

These diagrams illustrate how it is possible to design a three-terminal TCOIL circuit that provides a bandwidth of about 20 GHz using current technology. To accomplish this bandwidth, the value of inductor L1 should be less than half the value of inductor L2. Likewise, there should be a low coupling factor between L1 and L2. These diagrams further illustrate, however, that to increase bandwidth even further (as is needed to support 56 Gbps SerDes technology, for example), an even larger value of inductance L2 (while keeping L1 constant) should be used. However, a larger value of inductance requires more space. Meanwhile, as set forth above, the area for the TCOIL circuit is limited, and so there is a need for another approach for increasing bandwidth.

Figure 5A:
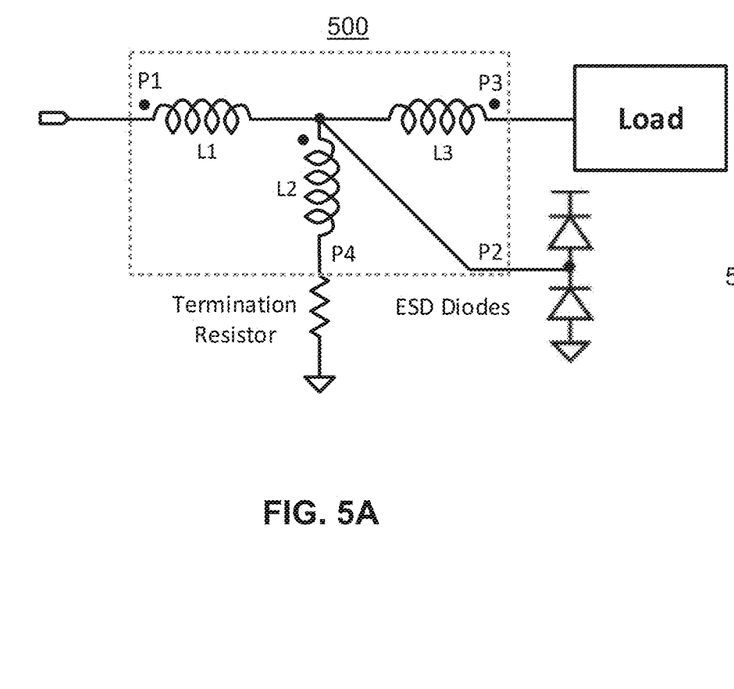
FIG. 5A is a circuit diagram illustrating an example TCOIL 500 according to embodiments.

As set forth above, according to certain aspects, the present embodiments aim to solve these and other design challenges for wireline TX/RX terminations. According to additional aspects, the present embodiments relate to a four-terminal TCOIL structure that consumes the same amount of area on the chip as the traditional three-terminal design, while providing more bandwidth and less reflection and group delay variation FIG. 5A is a circuit diagram illustrating an example TCOIL 500 according to embodiments. This example TCOIL is shown in connection with a RX portion of a SerDes transceiver (shown as Load in this diagram), but it should be apparent that TCOIL 500 could also be used in connection with a TX portion of a SerDes transceiver.

As shown in FIG. 5A, and differently from the previously described circuits, TCOIL 500 has four terminals, designated in FIG. 5A as P1, P2, P3 and P4. Further differently from the previously described circuits, TCOIL 500 includes a third inductor L3 added to the existing centertap between inductor L1 and inductor L2. This third inductor L3 is connected to the load (in a RX example) via terminal P3. As will be explained in more detail below, in embodiments of TCOIL 500, there is negligible coupling between inductor L3 and inductor L1, whereas there is positive coupling between inductor L3 and inductor L2. According to certain aspects, the addition of inductor L3 in this manner helps extending bandwidth in two ways. First, it provides a series peaking inductor to spread out the total load on the centertap. And second, the positive coupling between L3 and L2 increases the total inductance of L2 without area penalty.

As further shown in FIG. 5A, in a typical example, ESD diodes are connected to the centertap via terminal P2, and a termination resistor is connected to inductor L2 via terminal P4.

Figure 5B:
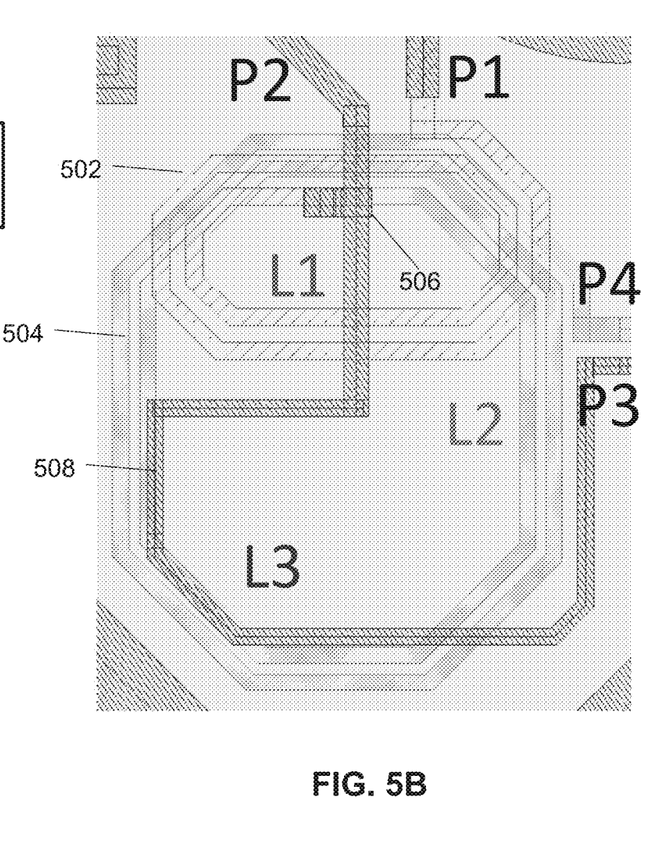
FIG. 5B is a layout diagram illustrating a portion of an example IC including one possible implementation of a TCOIL according to embodiments.

FIG. 5B is a layout diagram illustrating a portion of an example IC including one possible implementation of TCOIL 500.

As shown in FIG. 5B, and similar to the three-terminal example shown in FIG. 3B, the coil 502 of inductor L1 may be provided in one metal layer of the integrated circuit, and the coil 504 of inductor L2 a second different metal layer of the integrated circuit. The center tap 506 may be provided in a third different metal layer of the integrated circuit. Differently from the three-terminal example, the TCOIL 500 further includes coil 508 of inductor L3. This coil 508 may be provided in a layer that is different than the layer of coil 502 and 504.

Figure 6:
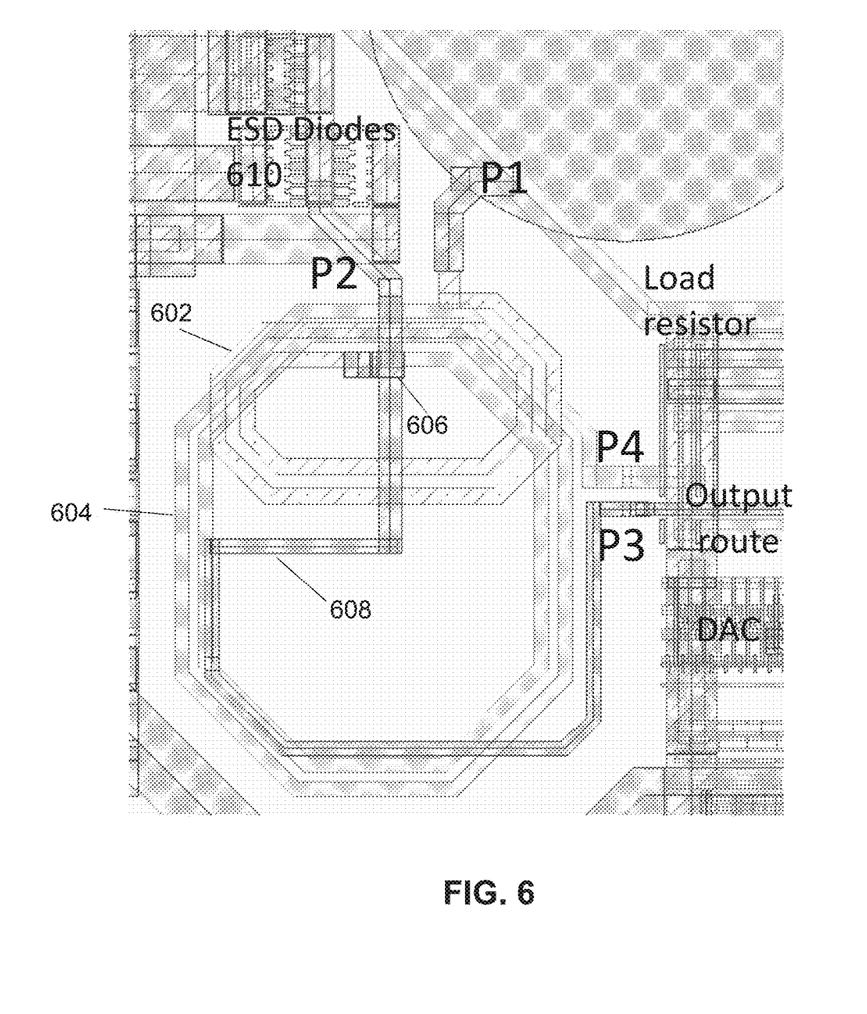
FIG. 6 is a layout diagram illustrating a portion of an example IC including a 4-terminal TCOIL according to embodiments.

FIG. 6 is a layout diagram illustrating a portion of an example IC including a 4-terminal TCOIL according to embodiments. This TCOIL portion is illustrated in connection with an example TX portion of a SerDes transceiver, but it should be appreciated that implementation of the TCOIL in a RX portion of a SerDes transceiver would be similar.

Similar to the example TCOIL in FIG. 5B, the coil 602 of inductor L1 may be provided in one metal layer of the integrated circuit, and the coil 604 of inductor L2 a second different metal layer of the integrated circuit. The center tap 606 may be provided in a third different metal layer of the integrated circuit. Coil 608 of the third inductor L3 may be provided in a layer that is different than the layer of coil 602 and 604.

FIG. 6 further illustrates an example of how ESD diodes can be connected in the same metal layer of the integrated circuit and at centertap 606. This may improve the reflection coefficient (S11) of transmitter or receiver. FIG. 6 also illustrates an example of how a load resistor can be connected in the same metal layer of the integrated circuit and at terminal P4 of inductor L2. FIG. 6 likewise illustrates an example of how the output of a DAC can be connected in the same metal layer of the integrated circuit and at terminal P3 of the third inductor L3.

In one example CMOS implementation of the integrated circuit shown in FIG. 6, inductor L1 is provided on metal layer M13, and is dimensioned to have an inductance value of about 200 pH. Those skilled in the art of CMOS technology understand how to control an inductance value of an inductor such as L1 by adjusting outer and inner dimensions, number of turns, turn spacing, etc. As further shown, inductor L2 is provided on metal layer M12, and is dimensioned to have an inductance value of about 580 pH. The series inductor L3 is provided on the AP layer, and is dimensioned to have an inductance value of around 100 pH.

As further indicated in this example, the coupling factor K between inductor L1 and L2 is controlled to be about 0.28. The coupling factor K can be reduced, for example by minimizing the overlap between L1 and L2 and therefore limiting the amount of magnetic flux that is generated in L1 to penetrate L2. Moreover, the coupling factor K between inductor L2 and L3 is controlled to be about 0.16. In this example where L3 is positively coupled to L2, the bandwidth of about 20 GHz for a similar three-terminal TCOIL is extended to about 29 GHz (about 50% uplift), without any additional area consumed by the circuit. It should be noted that various other relative coupling factors between inductors L1/L2 and L2/L3 are possible, depending on design considerations, and so the above examples are not limiting.

Figures 7A, 7B, 7C:
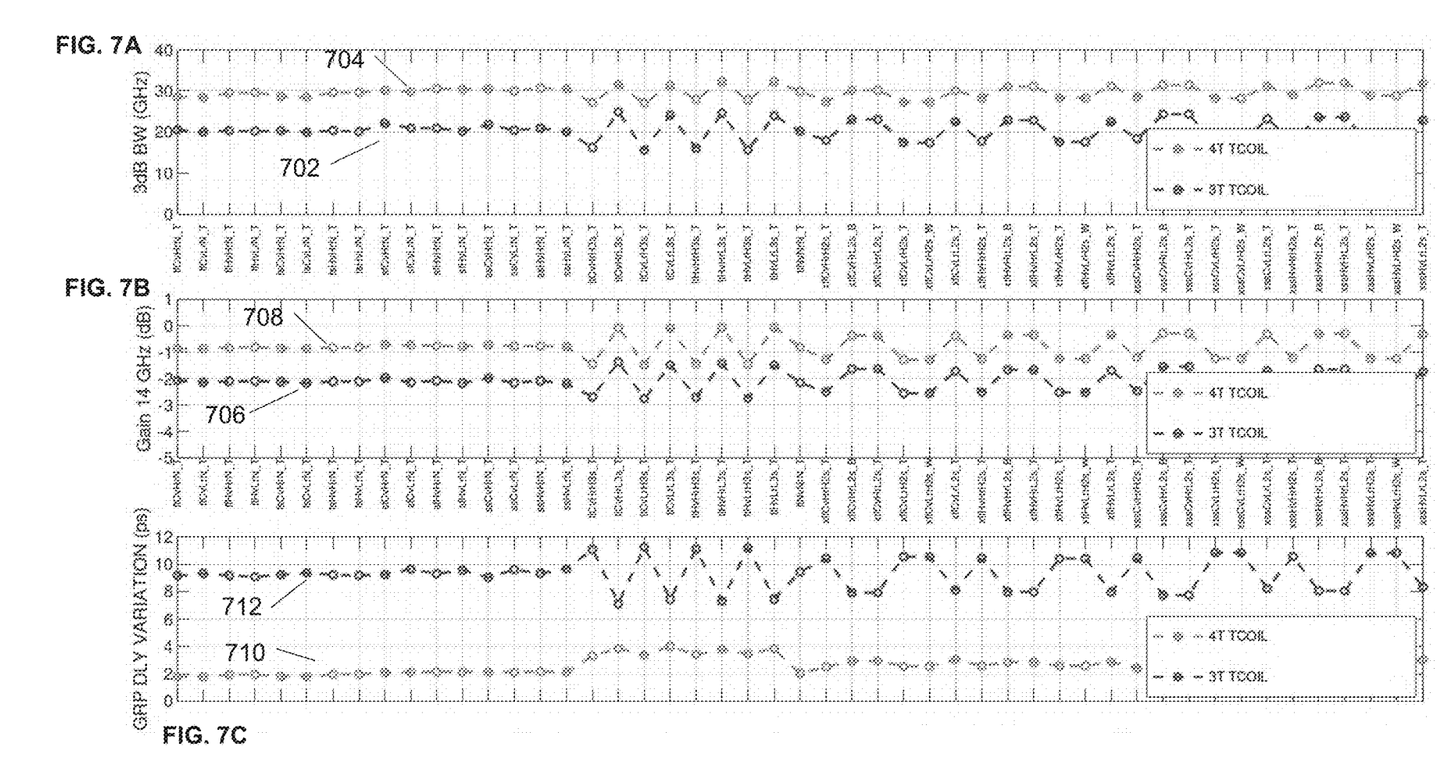
FIGS. 7A to 7C are diagrams illustrating aspects of the present embodiments.

FIGS. 7A to 7C are diagrams illustrating aspects of the present embodiments.

FIG. 7A are plots comparing the bandwidth (y-axis, in GHz) for a plurality of different process/temperature/voltage corners (x-axis) for an example TCOIL design. The plot labeled 702 provides bandwidth measurements of a three-terminal version for each corner, whereas the plot labeled 704 provides bandwidth measurements for the same design, as adapted with a four-terminal arrangement according to embodiments. As can be seen in FIG. 7A, in general there is a 50% bandwidth improvement from the three-terminal version to the four-terminal version.

FIG. 7B are plots comparing the 3 dB gain at 14 GHz (y-axis, in dB) for a plurality of different corners (x-axis). The plot labeled 706 provides gain measurements for a three-terminal version of a TCOIL design, whereas the plot labeled 708 provides gain measurements for the same design, as adapted with a four-terminal arrangement according to embodiments. As can be seen in FIG. 7B, in general there is a 1 dB gain improvement from the three-terminal version to the four-terminal version.

FIG. 7C are plots comparing the group delay variation (y-axis, in picoseconds) for a plurality of different corners (x-axis). The plot labeled 712 provides group delay variation measurements for a three-terminal version of a TCOIL design, whereas the plot labeled 710 provides bandwidth measurements for the same design, as adapted with a four-terminal arrangement according to embodiments. As can be seen in FIG. 7C, there is about 8 ps less group delay variation with the four-terminal version than the three-terminal version.

Figures 8A, 8B:
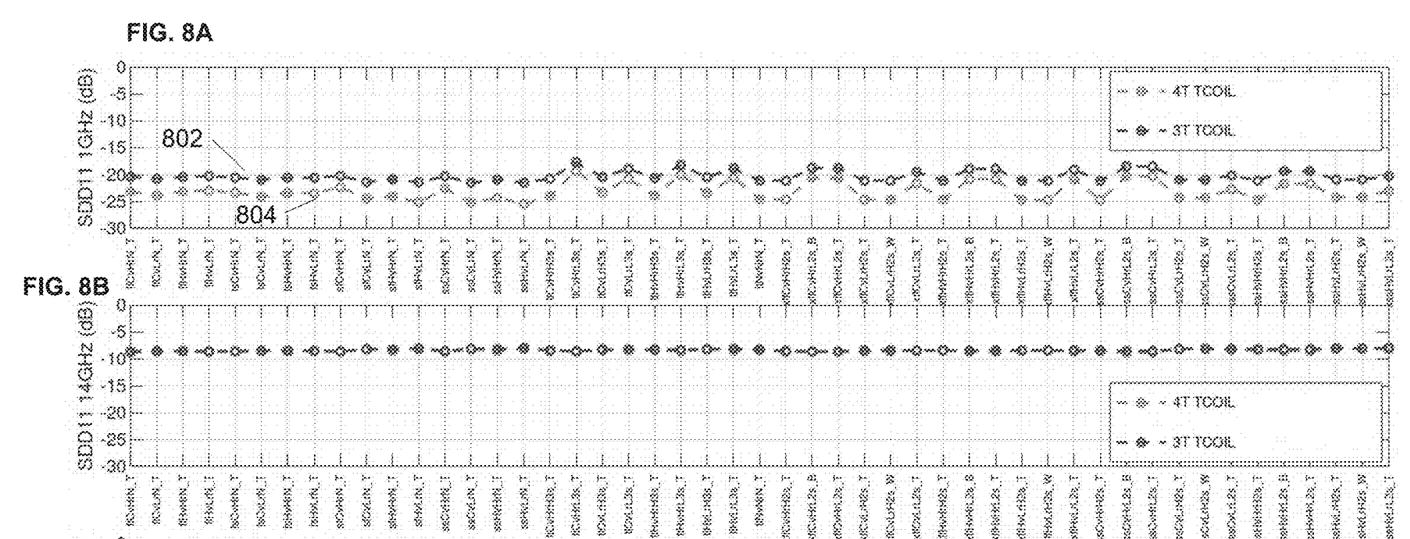
FIGS. 8A to 8C are diagrams illustrating aspects of the present embodiments.
Figure 8C:
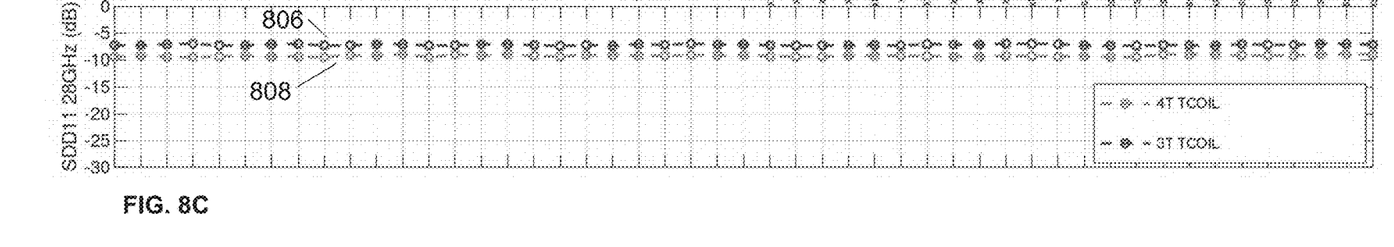

FIGS. 8A to 8C are diagrams illustrating aspects of the present embodiments.

FIG. 8A are plots comparing the SD11 reflection at 1 GHz (y-axis, in dB) for a plurality of different corners (x-axis). The plot labeled 802 provides reflection measurements for a three-terminal version of a TCOIL design, whereas the plot labeled 804 provides reflection measurements for the same design, as adapted with a four-terminal arrangement according to embodiments. As can be seen in FIG. 8A, in general there is a slight reflection improvement from the three-terminal version to the four-terminal version.

FIG. 8B are plots showing the SD11 reflection at 14 GHz (y-axis, in dB) for a plurality of different corners (x-axis). The plots largely overlap each other at this frequency. In other words the reflection measurements are about the same in the three-terminal and four-terminal versions in this example.

FIG. 8C are plots comparing the SD11 reflection at 28 GHz (y-axis, in dB) for a plurality of different corners (x-axis). The plot labeled 806 provides reflection measurements for a three-terminal version of a TCOIL design, whereas the plot labeled 808 provides reflection measurements for the same design, as adapted with a four-terminal arrangement according to embodiments. As can be seen in FIG. 8A, in general there is a slight reflection improvement from the three-terminal version to the four-terminal version.

Figure 9:
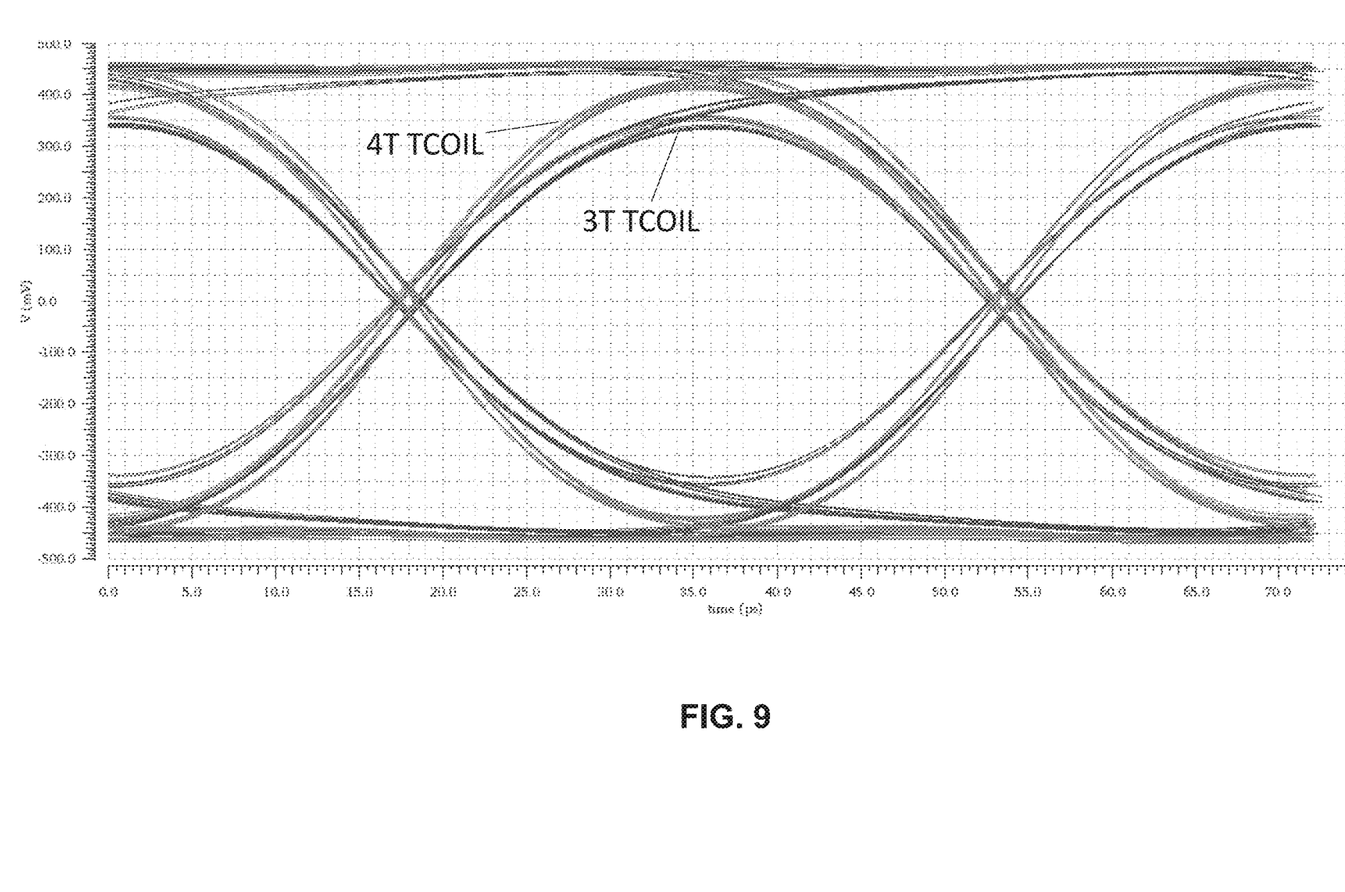
FIG. 9 is a waveform diagram illustrating aspects of the present embodiments.

FIG. 9 is a waveform diagram illustrating aspects of the present embodiments. As shown in FIG. 9, due to the higher bandwidth and lower group delay variation with the four-terminal version of the TCOIL design versus the three-terminal version, there is a better-defined NRZ eye at the TX output.

Figure 10:
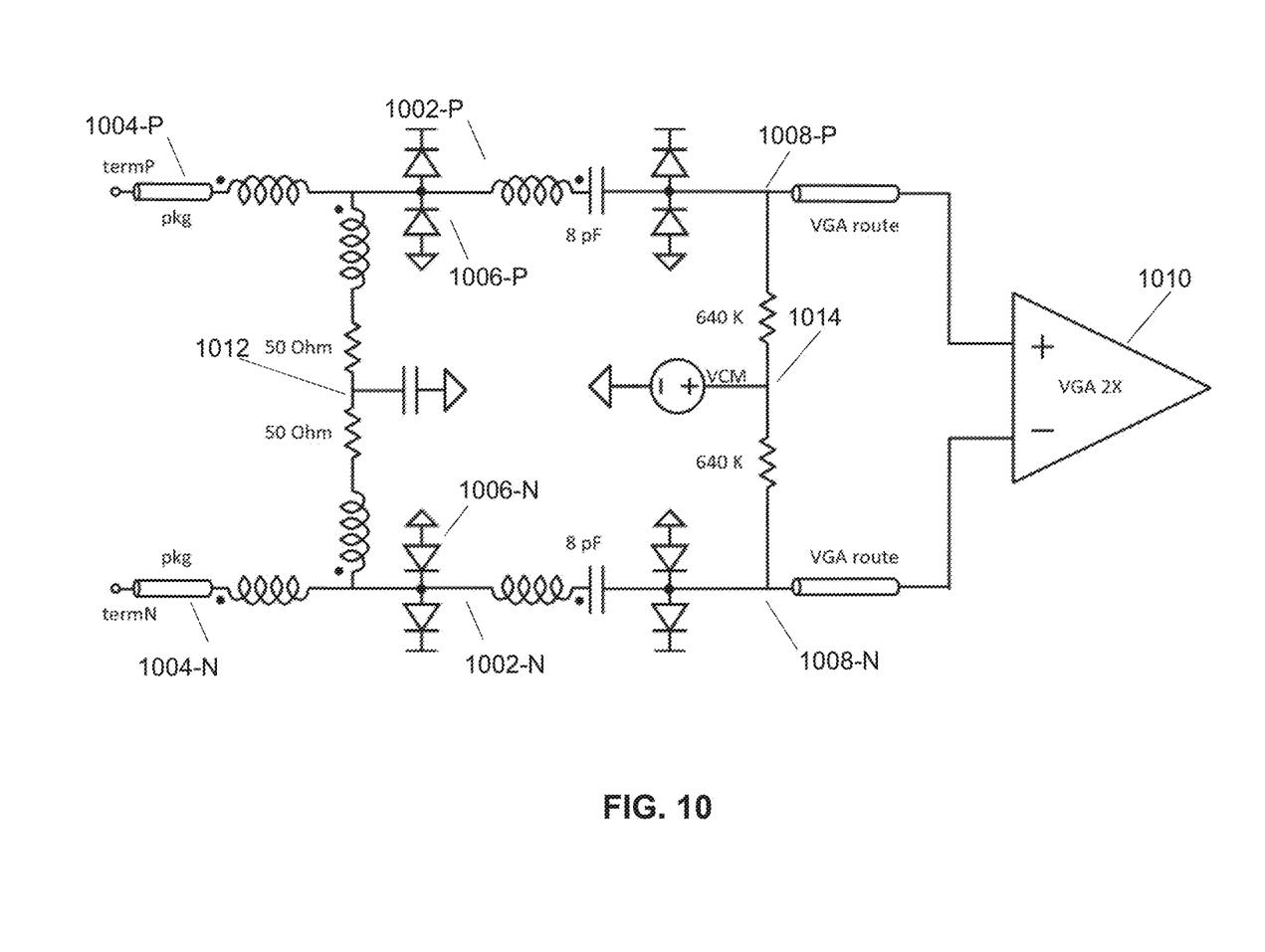
FIG. 10 is a circuit diagram illustrating an example of how a four-terminal TCOIL design according to embodiments can be implemented in a RX portion of a SerDes transceiver.

FIG. 10 is a circuit diagram illustrating an example of how a four-terminal TCOIL design according to embodiments can be implemented in a RX portion of a SerDes transceiver.

As can be seen, there are duplicate TCOIL circuits 1002-P and 1002-N connected between both of the P and N pad inputs 1004-P and 1004-N, respectively, and the RX 1010 inputs 1008-P and 1008-N, respectively. Also shown are the ESD diodes 1006-P and 1006-N attached to the center taps of each TCOIL circuit. For completeness, FIG. 10 also shows how the termination resistors of each TCOIL can be commonly connected at node 1012, as well as how the common-mode voltages at 1008-P and 1008-N can be commonly adjusted at node 1014.

Although the present embodiments have been particularly described with reference to preferred examples thereof, it should be readily apparent to those of ordinary skill in the art that changes and modifications in the form and details may be made without departing from the spirit and scope of the present disclosure. It is intended that the appended claims encompass such changes and modifications.

What is claimed is:
1. A TCOIL circuit comprising:
a first terminal coupled to an input;
a second terminal coupled to an electrostatic discharge (ESD) device;
a third terminal coupled to a load; and
a fourth terminal coupled to a termination resistor, wherein the first terminal, the second terminal, the third terminal and the fourth terminal of the TCOIL circuit each comprise physically separate metal structures in a plurality of different layers of an integrated circuit.

2. The TCOIL circuit of claim 1, further comprising:
a first inductor coupled between the first terminal and a center tap;
a second inductor coupled between the center tap and the third terminal; and
a third inductor coupled between the center tap and the fourth terminal.

3. The TCOIL circuit of claim 2, wherein the third inductor has a smaller inductance than inductances of the first and second inductors.

4. The TCOIL circuit of claim 2, wherein the third inductor is more electromagnetically coupled to the second inductor than the first inductor.

5. The TCOIL circuit of claim 2, wherein an amount of electromagnetic coupling between the third inductor and the second inductor is greater than an amount of electromagnetic coupling between the first inductor and the second inductor.

6. The TCOIL circuit of claim 2, wherein the first, second and third inductors are provided in respective first, second and third different ones of the layers of the integrated circuit.

7. The TCOIL circuit of claim 1, wherein the first terminal, the second terminal, the third terminal and the fourth terminal of the TCOIL circuit each comprise physically separate electrical terminals of the TCOIL circuit.

8. The TCOIL circuit of claim 1, where the first terminal is directly connected to the input, the second terminal is directly connected to the ESD device, the third terminal is directly connected to the load, and the fourth terminal is directly connected to the termination resistor.

9. A transceiver comprising:
an input or output termination; and
a TCOIL circuit coupled to one of the input or output termination, the TCOIL circuit including
a first terminal coupled to an input;
a second terminal coupled to an electrostatic discharge (ESD) device;
a third terminal coupled to a load; and
a fourth terminal coupled to a termination resistor, wherein the first terminal, the second terminal, the third terminal and the fourth terminal of the TCOIL circuit each comprise physically separate metal structures in a plurality of different layers of an integrated circuit.

10. The transceiver of claim 9, wherein the TCOIL circuit further includes:
a first inductor coupled between the first terminal and a center tap;
a second inductor coupled between the center tap and the third terminal; and
a third inductor coupled between the center tap and the fourth terminal.

11. The transceiver of claim 10, wherein the third inductor has a smaller inductance than inductances of the first and second inductors.

12. The transceiver of claim 10, wherein the third inductor is more electromagnetically coupled to the second inductor than the first inductor.

13. The transceiver of claim 10, wherein an amount of electromagnetic coupling between the third inductor and the second inductor is greater than an amount of electromagnetic coupling between the first inductor and the second inductor.

14. The transceiver of claim 10, wherein the first, second and third inductors are provided in respective first, second and third different ones of the layers of the integrated circuit.

15. A serial-deserializer (SerDes) circuit comprising:
   a transceiver, the transceiver having an input or output termination; and
   a TCOIL circuit coupled to one of the input or output termination, the TCOIL circuit including
      a first terminal coupled to an input;
      a second terminal coupled to an electrostatic discharge (ESD) device;
      a third terminal coupled to a load; and
      a fourth terminal coupled to a termination resistor, wherein the first terminal, the second terminal, the third terminal and the fourth terminal of the TCOIL circuit each comprise physically separate metal structures in a plurality of different layers of an integrated circuit.

16. The SerDes circuit of claim 15, wherein the TCOIL circuit further includes:
   a first inductor coupled between the first terminal and a center tap;
   a second inductor coupled between the center tap and the third terminal; and
   a third inductor coupled between the center tap and the fourth terminal.

17. The SerDes circuit of claim 16, wherein the third inductor has a smaller inductance than inductances of the first and second inductors.

18. The SerDes circuit of claim 16, wherein the third inductor is more electromagnetically coupled to the second inductor than the first inductor.

19. The SerDes circuit of claim 16, wherein an amount of electromagnetic coupling between the third inductor and the second inductor is greater than an amount of electromagnetic coupling between the first inductor and the second inductor.

20. The SerDes circuit of claim 16, wherein the first, second and third inductors are provided in respective first, second and third different ones of the layers of the integrated circuit.

\* \* \* \* \*